(12) United States Patent
Sung et al.

(10) Patent No.: US 6,180,453 B1
(45) Date of Patent: Jan. 30, 2001

(54) METHOD TO FABRICATE A DRAM CELL WITH AN AREA EQUAL TO FIVE TIMES THE MINIMUM USED FEATURE, SQUARED

(75) Inventors: JanMye Sung, Yang-Mei; Chih-Yuan Lu, Hsinchu, both of (TW)

(73) Assignee: Vanguard International Semiconductor Corporation, Hsin-Chu (TW)

(*) Notice: Under 35 U.S.C. 154(b), the term of this patent shall be extended for 0 days.

(21) Appl. No.: 09/216,794

(22) Filed: Dec. 21, 1998

(51) Int. Cl.⁷ .............................................. H01L 21/8242
(52) U.S. Cl. ............................................................ 438/256
(58) Field of Search ................................. 438/256, 250–255, 438/262, 800, 253, 286, 393–398, 672–675

(56) References Cited

U.S. PATENT DOCUMENTS

| | | |
|---|---|---|
| 5,478,768 | 12/1995 | Iwasa . |
| 5,600,591 | 2/1997 | Takagi .................................. 365/184 |
| 5,710,074 | 1/1998 | Tseng .................................... 438/253 |
| 5,714,401 | 2/1998 | Kim et al. . |
| 5,879,986 * | 3/1999 | Sung ...................................... 438/253 |

* cited by examiner

Primary Examiner—Charles Bowers
Assistant Examiner—Craig Thompson
(74) Attorney, Agent, or Firm—George O. Saile; Stephen B. Ackerman

(57) ABSTRACT

A process for fabricating a DRAM cell, with an area equal to five times the minimum feature, squared, ($5F^2$), has been developed. The process features the use of selectively formed, N+ single crystalline, silicon plugs, on underlying source/drain regions. The N+ single crystalline, silicon plugs, epitaxial deposited, are used to connect overlying crown shaped capacitor structures, to underlying source/drain region, as well as to connect a bit line metal structure, to another source/drain region.

24 Claims, 9 Drawing Sheets

METHOD TO FABRICATE A DRAM CELL WITH AN AREA EQUAL TO FIVE TIMES THE MINIMUM USED FEATURE, SQUARED

BACKGROUND OF THE INVENTION (1) Field of the Invention

The present invention relates to a process used to fabricate dynamic random access memory, (DRAM), devices, and more specifically to a fabrication process, using novel process sequences to reduce the area of the DRAM cell.

(2) Description of the Prior Art

The semiconductor industry is continually striving to improve the performance of semiconductor devices, while still attempting to reduce the cost of these same semiconductor devices. The use micro-miniaturazation, or the use of sub-micron features, for fabrication of semiconductor devices, such as dynamic random access memory, (DRAM), devices, has allowed the performance and cost objectives to be partially realized. For example smaller features allow reductions in performance degrading capacitance, and performance degrading resistances to achieved, while the use of smaller devices, result in the attainment of a greater number of semiconductor chips, from a specific size starting substrate, however still possessing device densities equal to, or greater than, larger semiconductor chips, and thus resulting in a reduction of the processing cost for a specific semiconductor chip to be realized.

Micro-miniaturization has been mainly accomplished by advances in specific semiconductor fabrication disciplines, such as photolithography and dry etching. The use of more sophisticated exposure cameras, as well as the use of more sensitive photoresist materials, have allowed sub-micron images to be created in photoresist layers. In addition the development of more advanced dry etching tools and etch recipes, have allowed the sub-micron images in overlying photoresist layers to be successfully transferred to underlying materials, used in the creation of advanced semiconductor devices. However to achieve DRAM densities of 1 gigabit, or greater, new processing and structural enhancements may also be needed to supplement the advances gained through micro-miniaturization. Currently the area needed for a DRAM cell is equal to about eight times the square of the minimum feature used, sometimes referred to as $8F^2$. The creation of DRAM devices, with small areas are limited by basic features of the DRAM cell, such as the word line, bit line, as well as the space between word lines, needed for contact for overlying bit line, and stacked capacitor structures. Prior art, such as Tseng, in U.S. Pat. No. 5,710,074, describes the use of a conductive plug, contacting a portion of a source/drain region, with the conductive plug located between a word line and an isolation region, allowing an overlying stacked capacitor structure to contact underlying source/drain regions, via the conductive plug. However in that prior art the space used between the isolation region and the word line, needed for a storage node contact hole, and the conductive plug, is too large for 1 gigabit DRAM designs.

This invention will describe a novel fabrication process, enabling a DRAM cell with an area equal to $5F^2$, (2.5F by 2.0F), to be achieved. This is accomplished by reducing the space between word lines, needed for subsequent bit line contact to a source/drain region, to the minimum feature, (1F), used, while reducing the space between a word line and an isolation region, needed for stacked capacitor structure to source/drain contact, to 0.5F. The reduction in these spaces is made possible by forming self-aligned, epitaxial silicon plugs, between the word lines, and between a word line and an isolation region, where the word lines are encapsulated by a silicon nitride capping layer, and insulator spacers. The heavily doped N+, epitaxial silicon, is deposited at a low temperature, and selectively forms only on the exposed source/drain regions, located between word lines, and between a word line and an isolation region.

SUMMARY OF THE INVENTION

It as an object of this invention to create a DRAM cell, consuming an area equal to about five times the square of the minimum feature used, ($5F^2$).

It is another object of this invention to create a DRAM cell in which a N+ single crystalline, silicon plug, is formed between word lines, or between a word line and an isolation region, via a selective, low temperature, epitaxial silicon deposition procedure.

It is still another object of this invention to use an N+ single crystalline, silicon plug, for contact between a crown shaped capacitor structure, and a source/drain region, located between a word line and an isolation region.

It is still yet another object of this invention to use an N+ single crystalline, silicon plug, and an overlying, conductive bit line plug, for contact between a bit line structure, and a source/drain region, located between two word lines.

In accordance with the present invention a method for creating a DRAM cell, with an area equal to about five times the square of the minimum feature used, using selectively grown, N+ single crystalline plugs, for contact of overlying capacitor structures, and for contact of overlying bit line structures, to underlying source/drain regions, has been developed. After formation of isolation regions, in a semiconductor substrate, word line structures, comprised of silicon nitride capped, polycide gate structures, on thin gate insulator layers, are formed between the isolation regions. The word lines, and the space between word lines, is formed using the minimum feature, (1F), used, while the space between a word line, and an isolation region, is about half of the minimum feature, (0.5F), used. After formation of source/drain regions, in areas of the semiconductor substrate, not covered by isolation regions, or by word lines, single crystalline, N+ silicon plugs, are selectively grown, only on the exposed source/drain regions. Crown capacitor structures are formed, each contacting a single crystalline, N+ silicon plug, in a region in which the silicon plug overlays a source/drain region located between a word line and an isolation region. A low dielectric constant, spin on glass, (SOG), layer is formed, and a bit line contact hole is opened in the SOG layer, exposing a single crystalline, N+ silicon plug, in a region in which the silicon plug overlays a source/drain region located between word lines. After formation of a conductive bit line plug, in the bit line contact hole, a bit line metal structure is formed overlying the SOG layer, and contacting the top surface of the conductive bit line plug, completing the formation of the DRAM cell, with dimensions of 2.5F by 2.0F, or with an area of $5F^2$.

BRIEF DESCRIPTION OF THE DRAWINGS

The object and other advantages of this invention are best described in the preferred embodiment with reference to the drawings that include.

DESCRIPTION OF THE PREFERRED EMBODIMENTS

The method of creating a DRAM cell with an area equal to five times the square of the minimum feature used, featuring the use of selectively grown, N+ single crystalline plugs, located between word lines, and between a word line and an isolation region, and used to connect overlying capacitor structure, and overlying bit line structures, to underlying source/drain regions, will now be described in detail. The DRAM cell in this invention has been described as a N channel, device, however this invention can also be used for P channel devices, by simply using P type ion implantation procedures, creating P type source/drain regions in a N well region, and using overlying P+ single crystalline silicon plugs. In addition this invention is described using crown shaped capacitor structures, however this invention can be used with other type stacked capacitor structures, as well.

Figure 1:
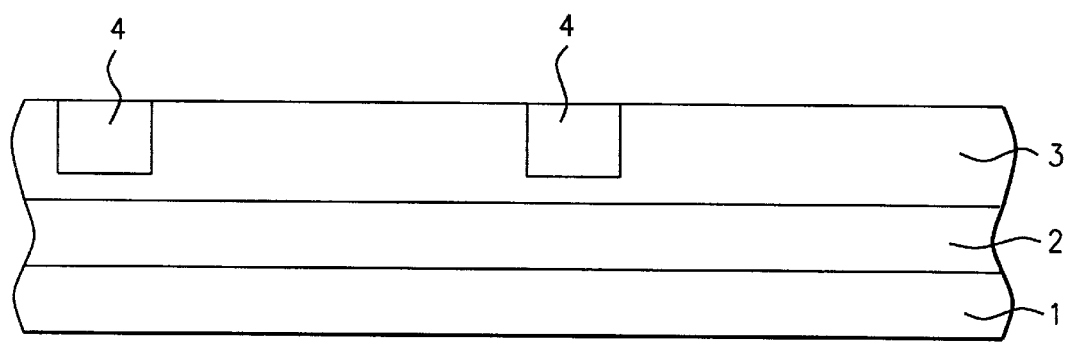
FIGS. 1–11, 12*b*, which schematically, in cross sectional style, describe key stages of fabrication used to create the DRAM cell, shown in this invention.

A P type, semiconductor substrate 1, comprised of single crystalline silicon, having a <100> crystallographic orientation, is used. Shallow trench isolation, (STI), regions 4, shown schematically in FIG. 1, are created for purposes of isolating subsequent components of a DRAM cell. Briefly the method used to create STI regions 4, are to create a shallow trench, to a depth between about 2000 to 4000 Angstroms, in semiconductor substrate 1, via conventional photolithographic and anisotropic reactive ion etching, (RIE), procedures, using $Cl_2$ as an etchant. After deposition of a silicon oxide layer, using low pressure chemical vapor deposition, (LPCVD), or plasma enhanced chemical vapor deposition, (PECVD), procedures, completely filling the shallow trench, chemical mechanical polishing, (CMP), or RIE procedures, are used to remove unwanted silicon oxide, resulting in silicon oxide filled, shallow trench isolation regions.

A deep N well region 2, is next formed in semiconductor substrate 1, via ion implantation of arsenic, at an energy between about 100 to 300 Kev., at a dose between about 1E11 to 1E12 atoms/$cm^2$, and phosphorous, at an energy between about 400 to 1000 Kev., at a dose between about 1E12 to 1E13 atoms/$cm^2$. The deep N well region is used to isolate DRAM cells, from the P type semiconductor substrate. Another ion implantation, using boron, is now performed, at an energy between about 1000 to 2000 Kev., at a dose between about 1E12 to 1E13 atoms/$cm^2$, to supply the dopants needed for the formation of a P well region 3, needed for creation of the N channel, metal oxide semiconductor field effect transistor, (MOSFET), devices, of the DRAM cell. The creation of deep N well region 2, and of P well region 3, are schematically shown in FIG. 1.

Figure 2:
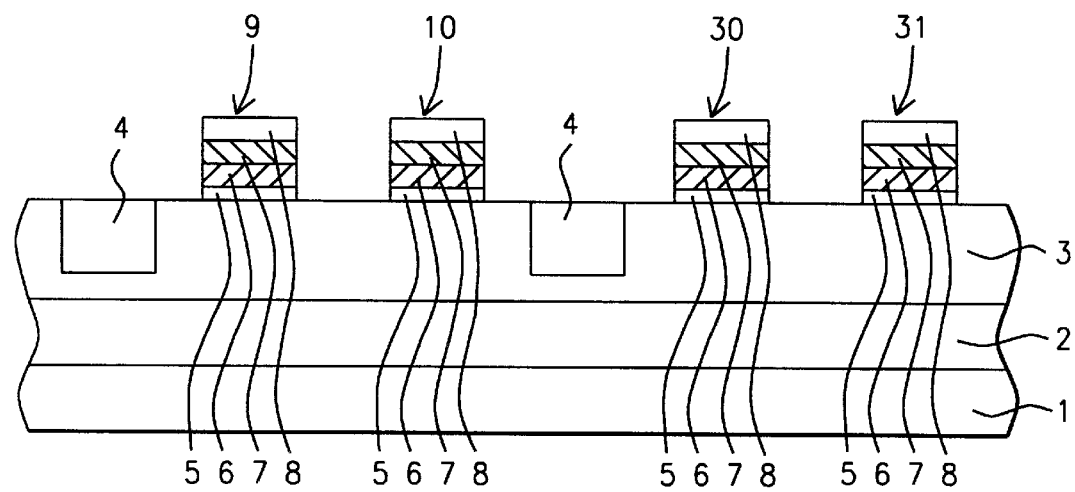

A gate insulator layer 5, comprised of silicon dioxide, at a thickness between about 35 to 70 Angstroms, is next thermally grown, in an oxygen—steam ambient, followed by the creation of word line structure 9, 10, 30 and 31, schematically shown in FIG. 2. After growth of gate insulator layer 5, a polysilicon layer 6, is deposited via LPCVD procedures, to a thickness between about 500 to 1000 Angstroms, with polysilicon layer 6, doped in situ, during deposition, via the addition of arsine, or phosphine, to a silane ambient. Polysilicon layer 6, can also be deposited intrinsically, then doped via an ion implantation procedure, using arsenic or phosphorous ions. Next a metal silicide layer 7, such as tungsten silicide, is deposited using LPCVD procedures, at a thickness between about 500 to 1500 Angstroms, using tungsten hexafluoride and silane as reactants. Finally a silicon nitride layer 8, is deposited, at a thickness between about 1000 to 3000 Angstroms, using LPCVD or PECVD procedures. Photolithographic and anisotropic RIE procedures, using $CF_4$ as an etchant for silicon nitride layer 8, and using $Cl_2$ as an etchant for metal silicide layer 7, and for polysilicon layer 6, are used to create word line structures 9, 10, 30, and 31, schematically shown in FIG. 2. Removal of the photoresist shape, used as a mask for word line patterning, is accomplished via plasma oxygen ashing, and careful wet cleans. The regions of gate insulator layer 5, not covered by the word line structures, were removed during the RIE and the photoresist removal procedures.

Figure 3:
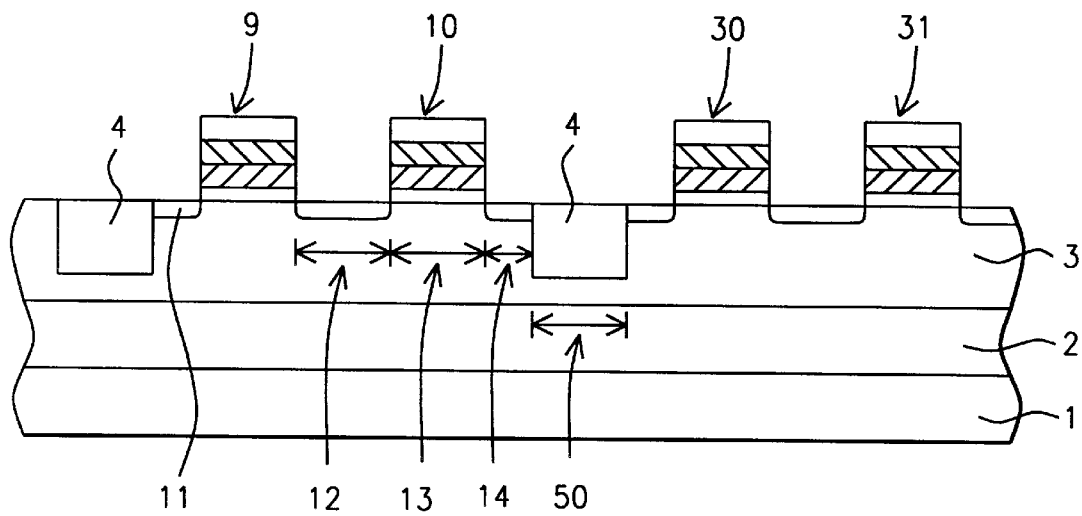
Figure 4:
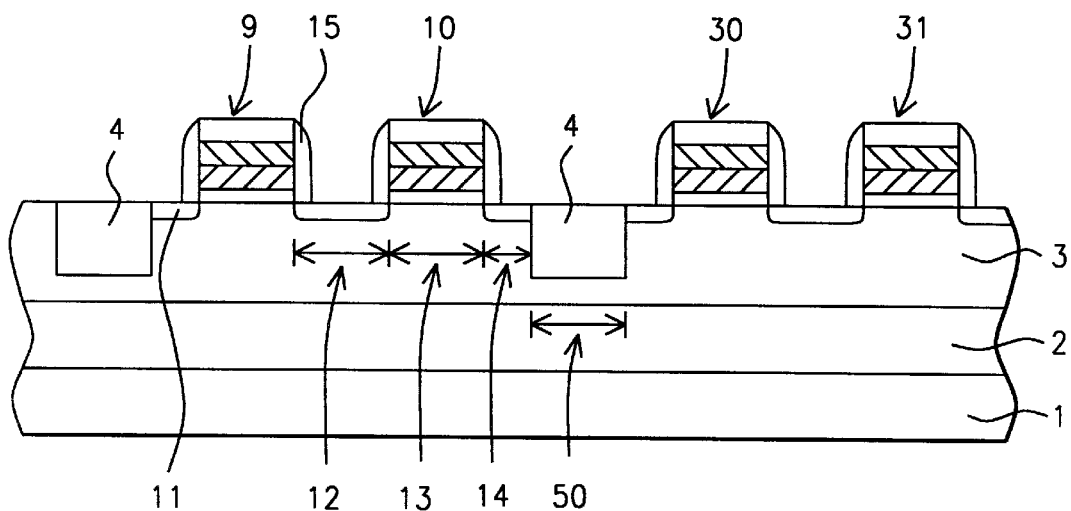

Width 13, of the word line structures 9, 10, 30 and 31, width 50, of isolation region 4, and space 12, between word line structures 9 and 10, and between word line structures 30 and 31, were all created using the minimum feature, (F), used. Therefore with a minimum design feature, F, for this DRAM cell, between about 0.07 to 0.25 uM, the width of word line structures, and of the isolation regions are between about 0.07 to 0.25 uM, while the space between word line structures 9 and 10, and between word line structures 30 and 31, is also between about 0.07 to 0.25 uM. In addition the placement of the word line structures result in space 14, between a word line structure, and an isolation region of only 0.5F, or if the minimum design feature used is between about 0.07 to 0.25 uM, this space would be between about 0.035 to 0.125 uM. This is schematically shown in FIG. 3. Source/drain regions 11, are next formed, in P well region 3, in regions not covered by word line structures, or by isolation regions. Source/drain regions 11, are formed via an ion implantation procedure, using arsenic or phosphorous ions, at an energy between about 5 to 20 KeV, at a dose between about 1E13 to 3E13 atoms/$cm^2$. Insulator spacers 15, comprised of silicon nitride, or of silicon oxide, are next created on the sides of the word line structures, via deposition of a silicon nitride layer, or of a silicon oxide layer, via LPCVD or PECVD procedures, to a thickness between about 200 to 800 Angstroms, followed by an anisotropic RIE procedure, using $CF_4$ for silicon nitride, or $CHF_4$ for silicon oxide, creating insulator spacers 15, shown schematically in FIG. 4.

Figure 5:
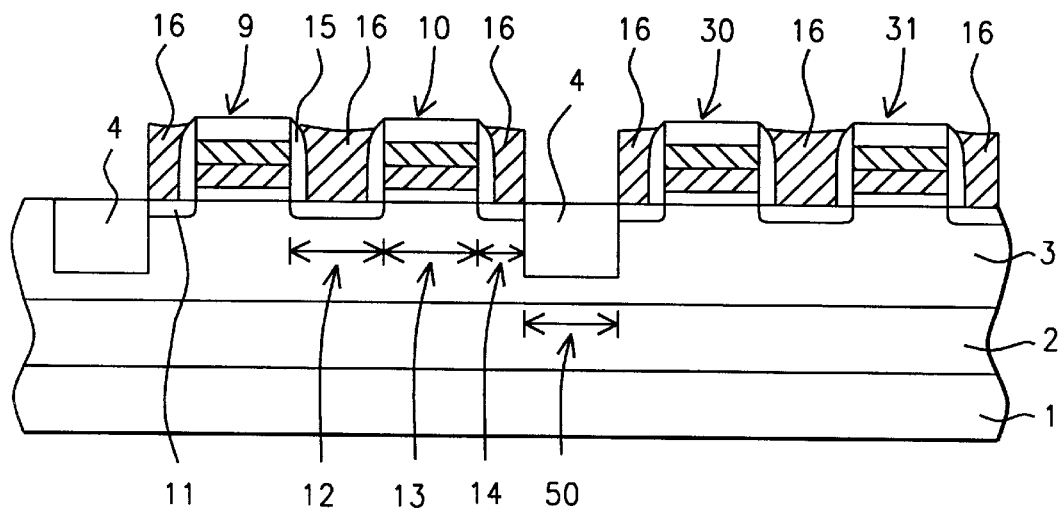

A major feature of this invention, the creation of the single crystalline, N+ silicon plugs, is next addressed and shown schematically in FIG. 5. Selective deposition of single crystalline, silicon plugs 16, is achieved via a low temperature epitaxial deposition, at a temperature between about 600 to 800° C., using silane or disilane as a source, with the addition of phosphine or arsine, as a dopant, resulting in single crystalline, N+ silicon plugs, with a bulk concentration between about 1E19 to 1E21 atoms/$cm^3$. Single crystalline, N+ silicon plugs 16, are vertically deposited to a thickness between about 3000 to 4000 Angstroms, about at the height, or slightly below the level of the word lines. The selective epitaxial deposition, only forming the plugs on exposed source/drain regions, result in a single crystalline, N+, silicon plug, contacting a source/drain region in space 12, having the same width as space 12, minus twice the thickness of insulator spacer 15, while another single crystalline, N+ silicon plug, contacting a source/drain region in space 14, has the same width as space 14, minus the thickness of one insulator spacer. The ability to selectively form single crystalline, N+ silicon plugs 16, avoids the removal of unwanted regions of this material, via CMP or RIE procedures, encountered with other conductive plug structures, such as tungsten or polysilicon plug structures.

Figure 6:
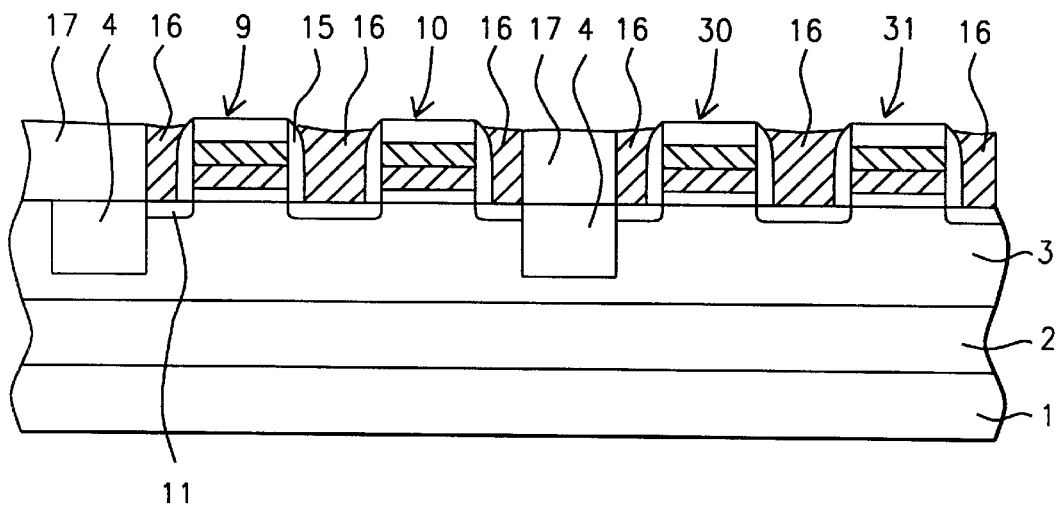

Regions, or spaces, located overlying isolation regions 4, and therefore not filled with the selective deposition of single crystalline, N+ silicon plugs 16, are next filled with silicon oxide layer 17, shown schematically in FIG. 6. First a silicon oxide layer is deposited via LPCVD, PECVD, or high density plasma chemical vapor deposition, (HDPCVD), procedures, to a thickness between about 4000 to 8000 Angstroms, completely filling the spaces between single crystalline, N+ silicon plugs 16, overlying isolation regions 4. Next a CMP procedure, or a selective RIE procedure, using $CHF_3$ as an etchant, is used to remove silicon oxide from the top surface of word lines 9, 10, 30, and 31, and from the top surface of single crystalline, N+ silicon plugs 16, resulting in silicon oxide plugs, formed from silicon oxide layer 17, located between single crystalline, N+ silicon plugs 16.

Figure 7:
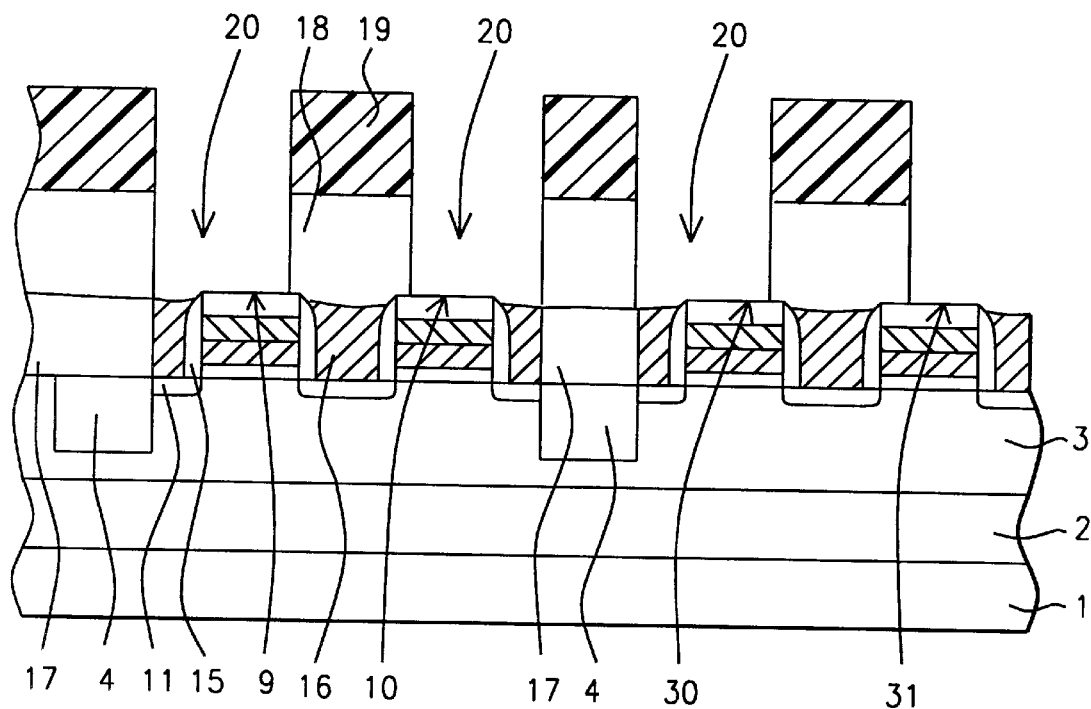
Figure 8:
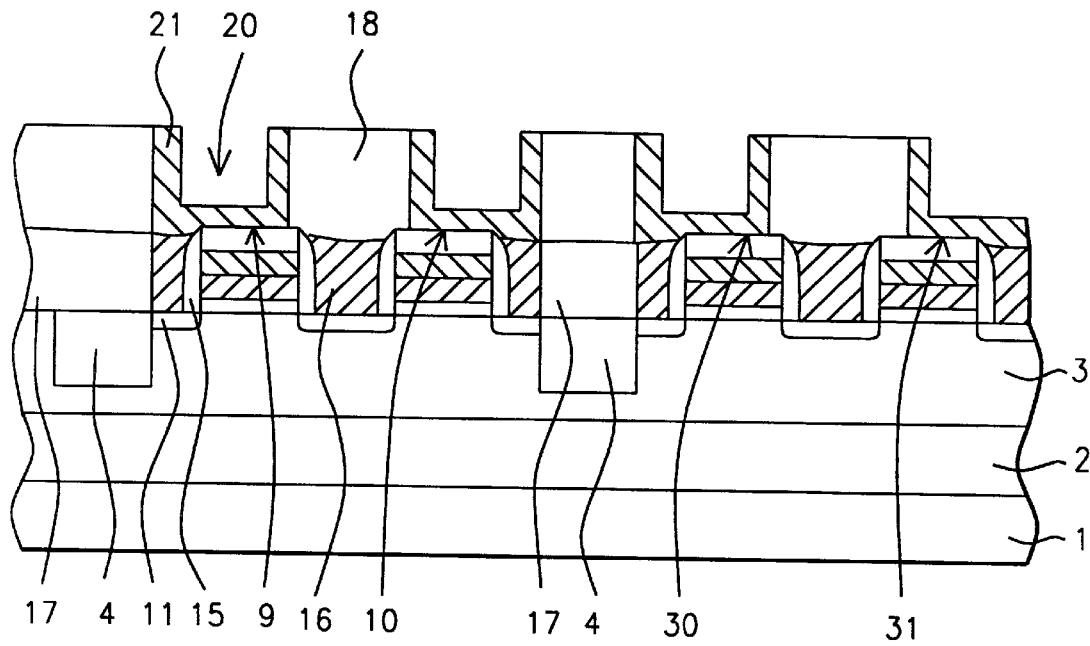
Figure 9:
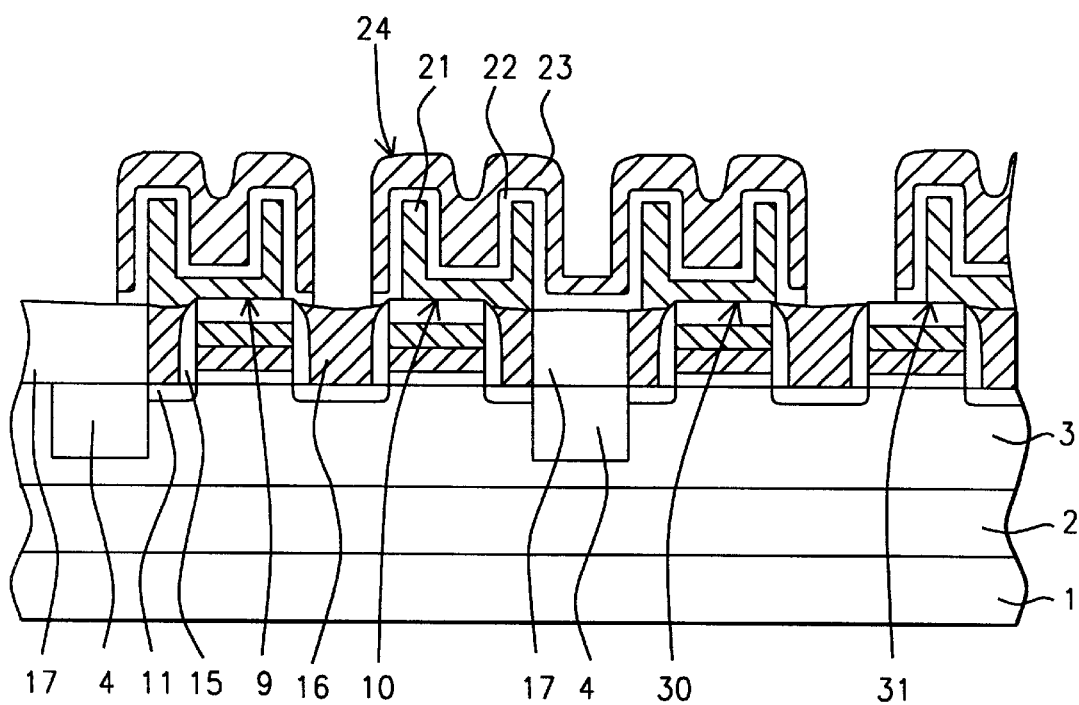

The process sequences, used to create crown shaped capacitor structures, is next addressed and shown schematically in FIGS. 7–9. First a silicon oxide layer 18, is deposited via LPCVD or PECVD procedures, at a thickness between about 5000 to 10000 Angstroms. A photoresist shape 19, is next formed, allowing capacitor openings 20, in silicon oxide layer 18, to be created via an anisotropic RIE procedure, using $CHF_3$ as an etchant. Capacitor openings 20, expose the top surface of single crystalline, N+ silicon plugs 16, located between a word line and silicon oxide layer 17. This will allow a subsequent capacitor structure to contact, through the single crystalline, N+ silicon plug, a source/drain region, located between a word line and an isolation region 4. This is schematically shown in FIG. 7. After removal of photoresist shape 19, via plasma oxygen ashing, and careful wet cleans, a polysilicon layer is deposited via LPCVD procedures, to a thickness between about 300 to 800 Angstroms. The polysilicon layer is doped in situ, during deposition, via the addition of arsine or phosphine, to a silane, or to a disilane ambient. A CMP procedure is used to remove unwanted regions of the polysilicon layer from the top surface of silicon oxide layer 18, resulting in a crown shaped storage node structures 21, comprised of the polysilicon layer, with vertical polysilicon spacers, on the sides of silicon oxide layer 18, exposed in capacitor opening 20, and comprised of a horizontal polysilicon feature, at the bottom of capacitor opening 20, connecting vertical polysilicon spacers, and contacting the top surface of single crystalline, N+ silicon plugs 16, located overlying a source/drain region, which in turn is located between a word line and an isolation region 4. This is schematically shown in FIG. 8.

Removal of regions of silicon oxide layer 18, located between crown shaped storage node structures 21, is accomplished via an anisotropic RIE procedure, using the appearance of the top surface of single crystalline, N+ silicon plugs 16, as an end point. A capacitor dielectric layer 22, such as $Ta_2O_5$, or oxidized silicon nitride, (ONO or NO), shown schematically in FIG. 9, is formed on the exposed surfaces of crown shaped storage node structures 21, at an equivalent silicon dioxide thickness of between about 20 to 50 Angstroms. Another in situ doped polysilicon layer, or a metal layer, is deposited, to a thickness between about 500 to 1000 Angstroms. Conventional photolithographic, and anisotropic RIE procedures, using $Cl_2$ as an etchant, are used to create upper plate 23, shown schematically in FIG. 9. Removal of the photoresist shape, used for definition of upper plate 23, is accomplished via plasma oxygen ashing and careful wet cleans, resulting in the DRAM capacitor structure 24, comprised of upper plate 23, capacitor dielectric layer 22, and crown shaped storage node structure 21, contacting, through a single crystalline, N+ silicon plug, a source/drain region, located between a word line and isolation region 4. DRAM capacitor 24, can be, if desired, any type stacked capacitor structure, not just the crown shaped structure, described above.

Figure 10:
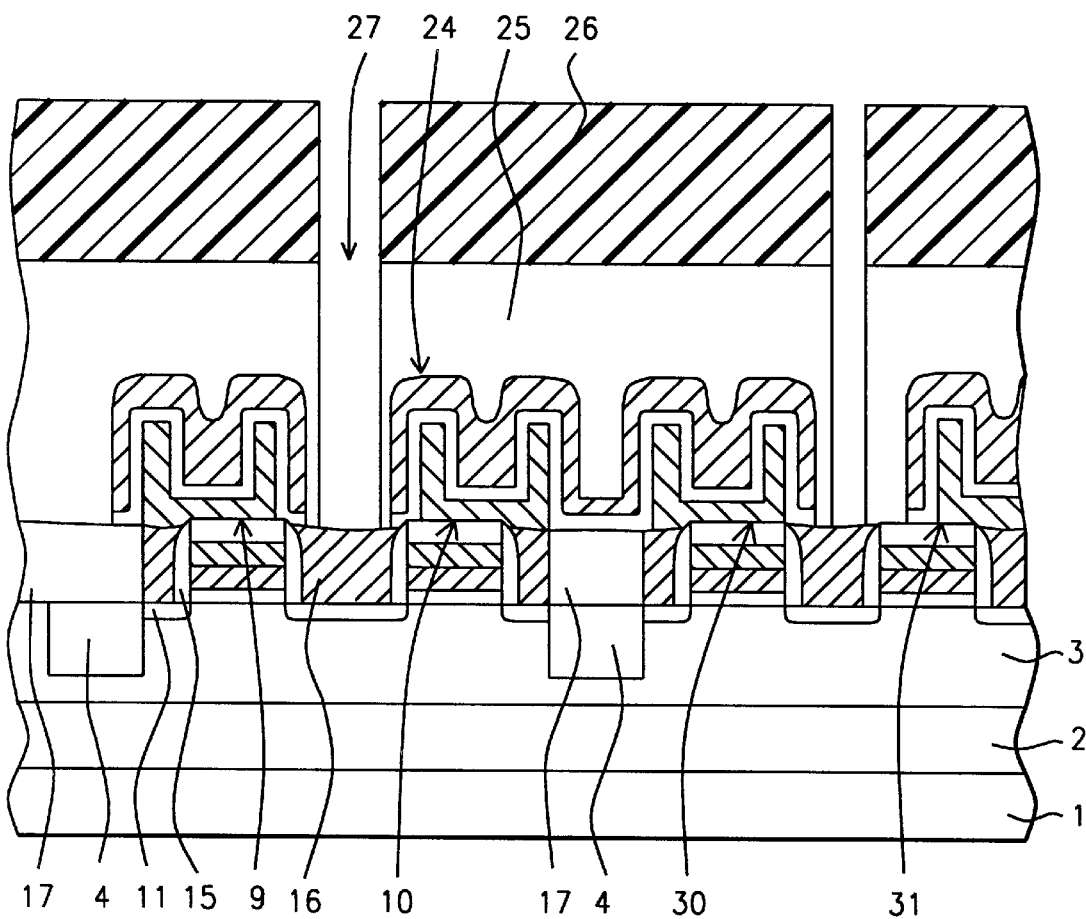
Figure 11:
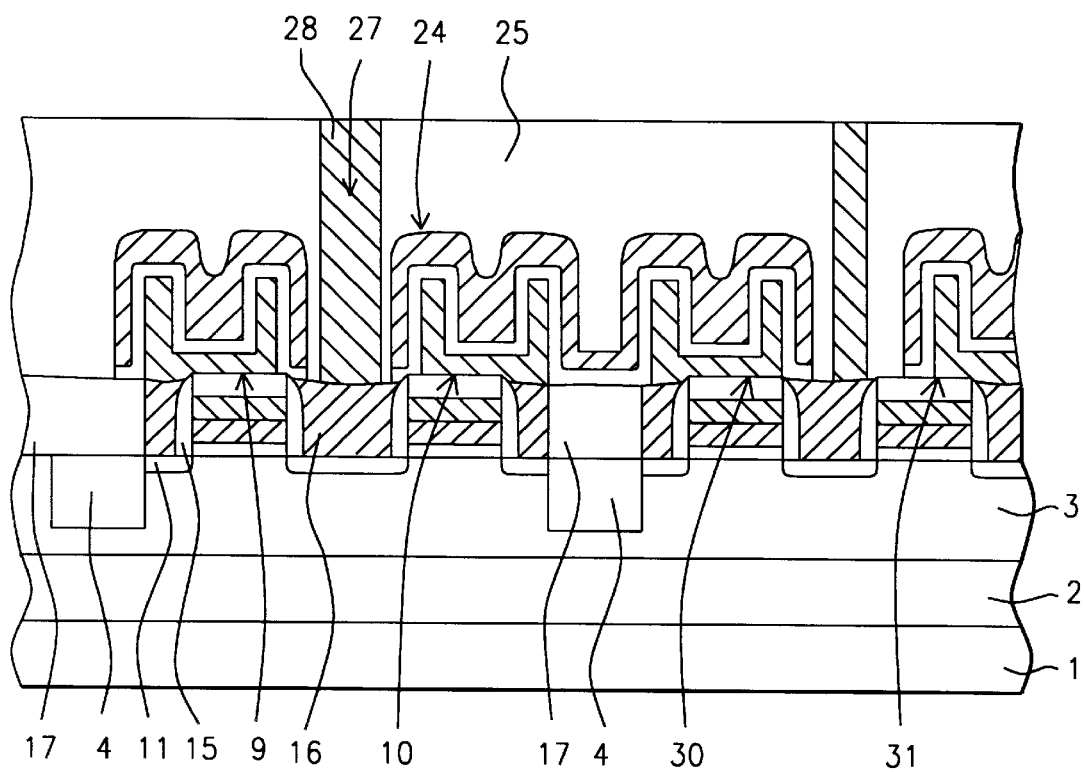

A spin on glass, (SOG), or a sub-atmospheric chemical vapor deposited, (SACVD), layer 25, is next formed at a thickness between about 3000 to 6000 Angstroms, to completely fill the spaces between DRAM capacitor structures 24. This is schematically shown in FIG. 10. Photoresist shape 26, is next used as a mask to allow the creation of bit line contact hole 27, through layer 25, to be achieved via an anisotropic RIE procedure using $CHF_3$ as an etchant. Bit line contact hole 27, with a diameter equal to about 1F, exposes the top surface of the single crystalline, N+ silicon plug 16, located between word lines. If desired an insulator spacer, (not shown in the drawings), can be formed on the sides of bit line contact hole 27, after removal of photoresist shape 26. This is accomplished via LPCVD or PECVD deposition of an insulator layer, such as silicon oxide, or silicon nitride, followed by the creation of the insulator spacer, via an anisotropic RIE procedure. After removal of photoresist shape 26, via plasma oxygen ashing and careful wet cleans, bit line contact plug 28, schematically shown in FIG. 11, is formed in bit line contact hole 27. Bit line contact plug is comprised of either tungsten, copper, or aluminum, all deposited using R.F. sputtering, to a thickness between about 1000 to 3000 Angstroms, completely filling bit line contact hole 27. Regions of unwanted metal, overlying the top surface of SOG layer 25, are removed using either CMP, or selective RIE procedures, using $Cl_2$ as an etchant, creating bit line contact plug 28, contacting a source/drain region, located between word lines, via a single crystalline, N+ silicon plug 16.

Figure 12A:
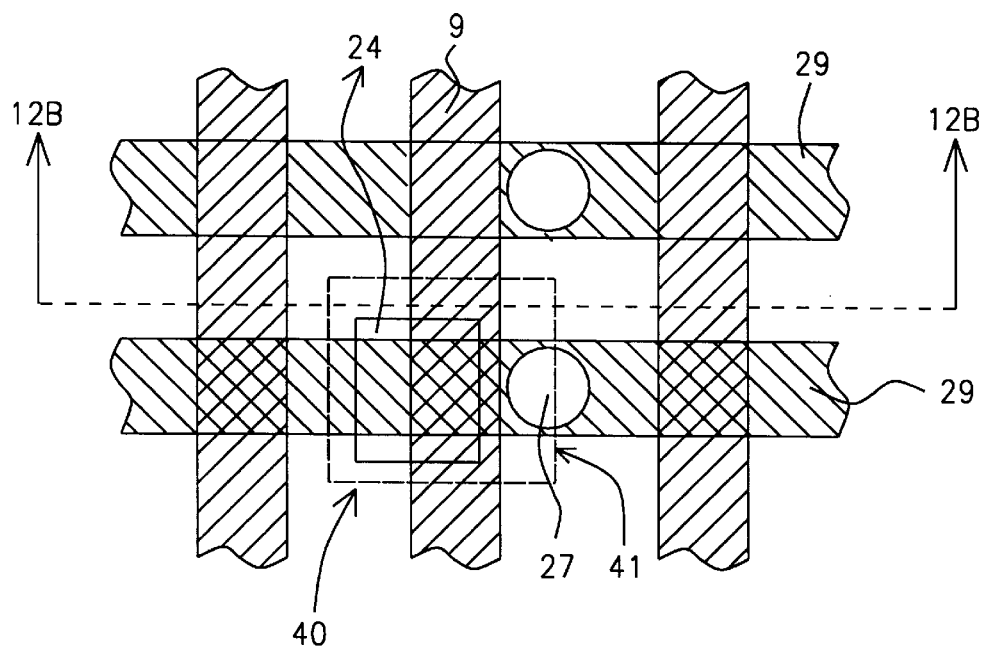
FIGS. 12*a*, which schematically shows a top view of the DRAM cell, described in this invention.
Figure 12B:
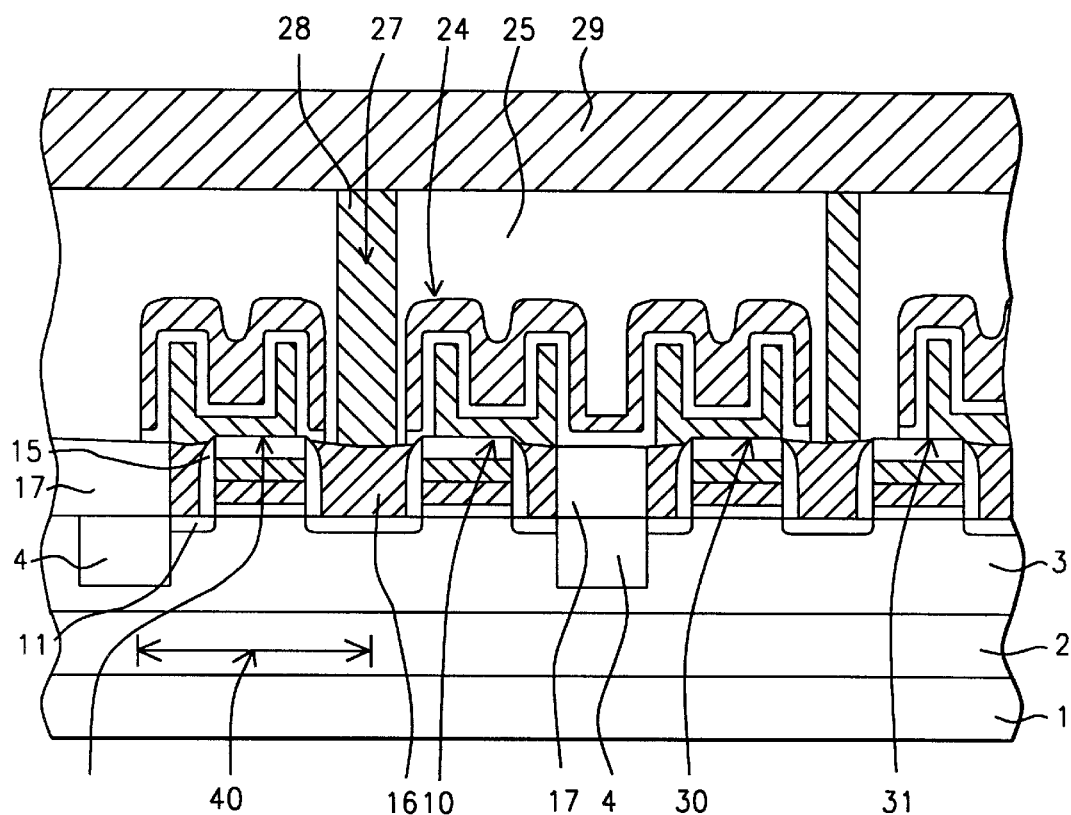

A bit line metal structure 29, is formed, and will be subsequently described using FIG. 12b, however FIG. 12a, now shows a top view of the DRAM cell, with a area equal to $5F^2$, comprised with a first dimension 40, equal to 2.5F, and with a second dimension 41, equal to 2.0F. Dimension 40, includes: a word line, equal to 1F; half of the space between word lines, equal to 0.5F; a space between a word line and an isolation region, equal to 0.5F; and half of an isolation region, equal to 0.5F. Referring to bit line metal structure 29, again either aluminum, tungsten, or copper, is deposited using R.F, sputtering procedures, to a thickness between about 2000 to 5000 Angstroms. Conventional photolithographic and anisotropic RIE procedures, using $Cl_2$ as an etchant, are used to create bit line metal structure 29, shown schematically in FIG. 12b. Bit line metal structure 29, aligned normal to underlying word lines, and overlying and contacting the top surface of bit line contact plug 28, communicates with a source/drain region, of the DRAM cell, located between word lines, via bit line contact plug 28, and single crystalline, N+ silicon plug 16. Removal of the photoresist shape, used for bit line metal structure definition, is once again removed using plasma oxygen ashing, and careful wet cleans.

Figure 13A:
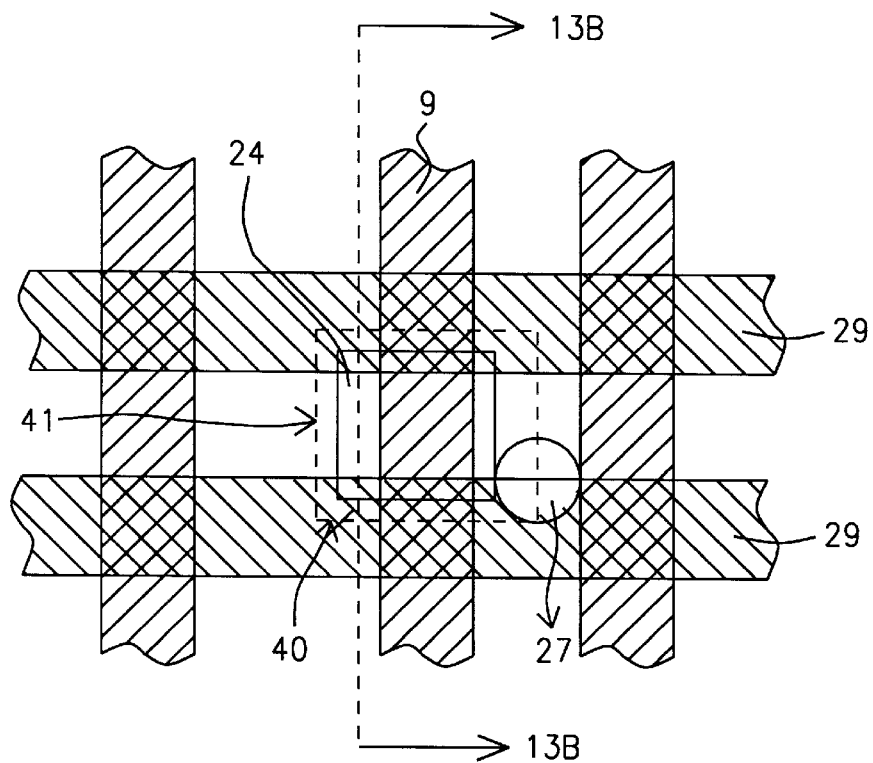
FIGS. 13a, and 13b, schematically show the top view, and a cross-sectional view, respectively, for COB structure.
Figure 13B:
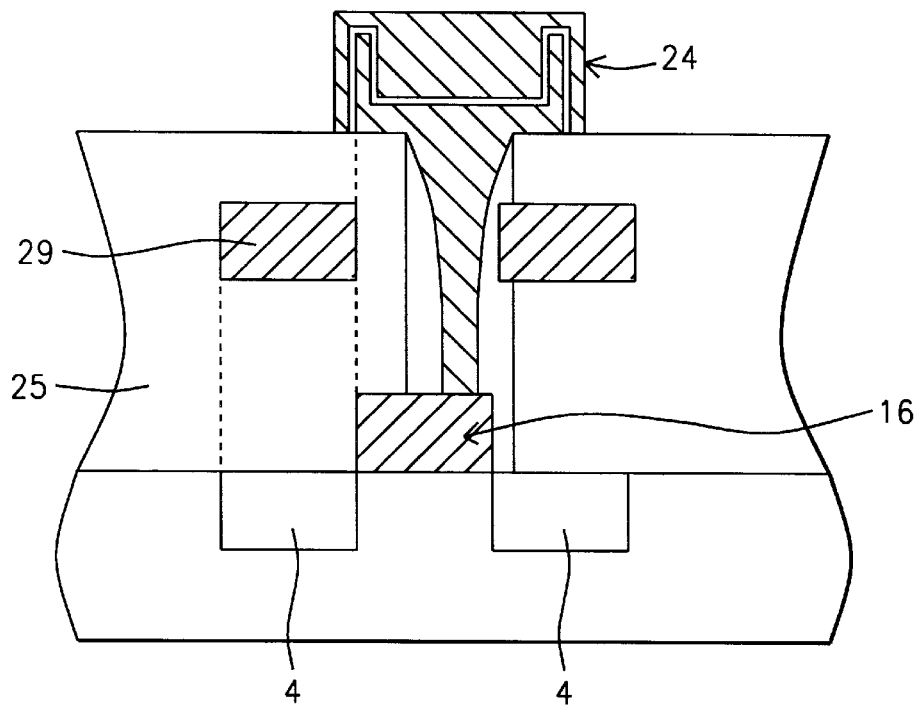

If desired this invention can be used to create capacitor over bit line, (COB), structures. This can be accomplished by delaying the creation of the capacitor opening. A bit line contact hole opening 27, with a diameter equal to 1F, can be formed in a thick insulator layer, exposing one half of the top surface an underlying N+ single crystalline plug, such as shape 16. After creation of a bit line contact plug structure 29, in the bit line contact hole 27, an overlying bit line structure, is formed, via deposition of either a metal, a polysilicon, or a polycide layer, and patterning, via conventional photolitographic and dry etching procedures, with the bit line structure, contacting the top surface of the bit line contact plug structure. The capacitor opening is than created in the thick insulator layer, or in a composite insulator layer, comprised of an overlying insulator layer, and the thick insulator layer, exposing the top surface of other N+ single crystalline plugs. The remainder of the process, used to form the capacitor structures, is identical to the processes used for the previously described, capacitor under bit line, (CUB), procedure. FIGS. 13A, and 13B, schematically show the top view, and a cross-sectional view, respectfully, for the COB structure.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a DRAM cell, on a semiconductor substrate, comprising the steps of:

forming a first, and a second isolation region, in said semiconductor substrate;

forming a first, and a second gate structure, on a gate insulator layer, on said semiconductor, with the gate structures located between said first isolation region, and said second isolation region;

forming source/drain regions in areas of said semiconductor substrate not covered by said gate structures, and not covered by isolation regions;

selectively growing single crystalline, silicon plugs, on said source/drain regions; with a first single crystalline, silicon plug, located between said first isolation region, and said first gate structure, overlying a first source/drain region; with a second, single crystalline, silicon plug, located between said first gate structure, and said second gate structure, overlying a second source/drain region; and with a third single crystalline silicon plug, located between a second gate structure, and a second isolation region, located overlying a third source/drain region;

forming insulator plugs overlying said first isolation region, and overlying said second isolation region;

forming a first capacitor structure, overlying, and contacting, said first single crystalline, silicon plug, and forming a second capacitor structure, overlying, and contacting said third single crystalline, silicon plug;

applying an insulator layer;

forming a bit line contact opening in said insulator layer, exposing the top surface of said second single crystalline, silicon plug;

forming a bit line contact plug, in said bit line contact hole opening, in said insulator layer, with said bit line contact plug contacting said second single crystalline, silicon plug, exposed in at the bottom of said bit line contact hole opening; and forming a bit line metal structure, overlying said insulator layer, overlying, and contacting, the top surface of said bit line contact plug.

2. The method of claim 1, wherein said minimum feature, (F), used, for said DRAM cell is between about 0.07 to 0.25 uM.

3. The method of claim 1, wherein said first isolation region, and said second isolation region, are insulator filled, shallow trenches, with a width equal to the minimum feature, (F), used, between about 0.07 to 0.25 uM, and at a depth between about 2000 to 4000 Angstroms, with said insulator, in shallow trench being silicon oxide, obtained via LPCVD or PECVD procedures.

4. The method of claim 1, wherein said first gate structure, and said second gate structure, are polycide structures, comprised of an overlying metal silicide layer, such as tungsten silicide, obtained via LPCVD procedures at a thickness between about 500 to 1000 Angstroms, and comprised of an underlying polysilicon layer, obtained via LPCVD procedures to a thickness between about 500 to 1000 Angstrom, and in situ doped, during deposition, via the addition of phosphine, or arsine, to a silane ambient, and with the width of said first gate structure, and of said second gate structure, equal to said minimum feature, (F), used, between about 0.07 to 0.250 uM.

5. The method of claim 1, wherein said space between said first gate structure, and said second gate structure, is equal to said minimum feature, (F), used, between about 0.07 to 0.25 uM.

6. The method of claim 1, wherein said space between said first gate structure and said first isolation region, and the space between said second gate structure and said second isolation region, is equal to one half of said minimum feature, (F), used, between about 0.035 to 0.125 uM.

7. The method of claim 1, wherein said source/drain regions are obtained via ion implantation of arsenic, or phosphorous, at an energy between about 5 to 20 KeV, at a dose between about 1E13 to 3E13 atoms/cm$^2$.

8. The method of claim 1, wherein said single crystalline, silicon plugs, are selectively formed, on underlying said source/drain regions, via a low temperature, epitaxial silicon deposition, at a temperature between about 600 to 800° C., to a thickness between about 3000 to 4000 Angstroms, and doped during the epitaxial silicon procedure, via the addition of arsine, or phosphine, to a silane, or to a disilane ambient.

9. The method of claim 1, wherein said first single crystalline, silicon plug, and said third single crystalline, silicon plug, have a width equal to one half of said minimum feature, (F), used, between about 0.035 to 0.125 uM, and with said second single crystalline, silicon plug, having a width equal to said minimum feature, (F), used, between about 0.07 to 0.25 uM.

10. The method of claim 1, wherein said first capacitor structure, and said second capacitor structure, are comprised of an underlying, polysilicon, crown shaped storage node structure, a capacitor dielectric layer, such as a $Ta_2O_5$ layer, or an ONO layer, and an overlying polysilicon upper plate.

11. The method of claim 1, wherein said insulator layer is a spin on glass, (SOG), layer, or a sub-atmospheric chemical vapor deposited layer, applied at a thickness between about 3000 to 6000 Angstroms.

12. The method of claim 1, wherein said bit line contact hole is opened in said insulator layer, using an anisotropic RIE procedure, using $CHF_3$ as an etchant, with the diameter of said bit line contact hole opening being equal to the minimum feature, (F), between about 0.07 to 0.250 uM.

13. The method of claim 1, wherein said bit line contact plug, is comprised of either tungsten, copper, or aluminum.

14. A method of fabricating a DRAM cell, on a semiconductor substrate, with an area equal to five times the minimum feature, squared, ($5F^2$), featuring selectively grown, single crystalline, silicon plugs, used to connect capacitor and bit line structures, to underlying source/drain regions, comprising the steps of:

forming a first isolation region, and a second isolation region, in said semiconductor substrate;

forming a silicon dioxide gate insulator layer, an area of said semiconductor substrate, not covered by said first isolation region, and not covered by said second isolation region;

forming a first silicon nitride capped, polycide gate structure, and a second silicon nitride capped, polycide gate structure, on said silicon dioxide gate insulator layer, between said first isolation region and said second isolation region, with the width of said first silicon nitride capped, polycide gate structure, and of said second silicon nitride capped, polycide gate structure equal to the minimum feature, (F), used, while the space between said first silicon nitride capped, polycide gate structure and said first isolation region, and the space between said second silicon nitride capped, polycide gate structure and said second isolation region, is equal to one half of the minimum feature used;

forming a first source/drain region between said first silicon nitride capped, polycide gate structure and said first isolation region, forming a second source/drain region between said first silicon nitride capped, polycide gate structure and said second silicon nitride capped, polycide gate structure, and forming a third source/drain region between said second polycide gate structure and said second isolation region;

selectively growing a first, N+ single crystalline, silicon plug, on said first source/drain region, and selectively growing a third, N+ single crystalline, silicon plug, on said third source/drain region, with the width of said first, N+ single crystalline, silicon plug, and the width of said third, N+ single crystalline, silicon plug, equal to one half the minimum feature, (F), used, and selectively growing a second, N+ single crystalline, silicon plug, on said second source/drain region, with the width of said second, N+ single crystalline, silicon plug, equal to the minimum feature, (F), used;

forming a first silicon oxide plug, on said first isolation region, and forming a second silicon oxide plug, on said second isolation region;

forming a first crown shaped capacitor structure, contacting underlying, said first, N+ single crystalline, silicon plug, and forming a second crown shaped capacitor structure, contacting underlying, said third, N+ single crystalline, silicon plug;

applying a spin on glass, (SOG), layer;

opening a bit line contact hole, in said SOG layer, exposing the top surface of said second, N+ single crystalline, silicon plug;

forming a bit line contact plug, in said bit line contact hole, contacting the top surface of underlying, said second, N+ single crystalline, silicon plug; and forming a bit line metal structure, overlying said SOG layer, and overlying and contacting the top surface of said bit line contact plug.

15. The method of claim 14, wherein said minimum feature, (F), used, for said DRAM cell, is between about 0.07 to 0.250 uM.

16. The method of claim 14, wherein said first isolation region, and said second isolation region, are comprised of silicon oxide filled, shallow trenches, with a width equal to about 0.07 to 0.250 uM, and with the depth of the shallow trenches, in said semiconductor substrate, between about 2000 to 4000 Angstroms.

17. The method of claim 14, wherein said silicon dioxide gate insulator layer, is obtained via thermal oxidation procedures, in an oxygen—steam ambient, to a thickness between about 35 to 70 Angstroms.

18. The method of claim 14, wherein said first silicon nitride capped, polycide gate structure, and said second silicon nitride capped, polycide gate structure, are comprised of a metal silicide layer, such as tungsten silicide, obtained via LPCVD procedures, at a thickness between about 500 to 1000 Angstroms, overlying a polysilicon layer, obtained via LPCVD procedures, at a thickness between about 500 to 1000 Angstroms, with the polysilicon layer doped in situ, during deposition, via the addition of arsine or phosphine, to a silane, or to a disilane ambient, and with a silicon nitride layer, obtained via LPCVD or PECVD procedures, at a thickness between about 1000 to 3000 Angstroms, overlying the metal silicide layer. of the polycide gate structures.

19. The method of claim 14, wherein the width of said first silicon nitride capped, polycide gate structure, and the width of said second silicon nitride capped, polycide gate structure, is between about 0.07 to 0.250 uM.

20. The method of claim 14, wherein the source/drain regions are formed via an ion implantation procedure, using arsenic or phosphorous ions, at an energy between about 5 to 20 KeV, at a dose between about 1E13 to 3E13 atoms/cm$^2$.

21. The method of claim 14, wherein the N+ single crystalline, silicon plugs, are formed via selective epitaxial deposition, at a temperature between about 600 to 800° C., to a thickness between about 3000 to 4000 Angstroms, and doped in situ, during the epitaxial deposition, via the addition of arsine, or phosphine, to a silane, or to a disilane ambient.

22. The method of claim 14, wherein said spin on glass layer is, applied at a thickness between about 3000 to 6000 Angstroms.

23. The method of claim 14, wherein said bit line contact plug, is comprised of either copper, aluminum, or tungsten.

24. A method of forming a DRAM cell, on a semiconductor substrate, with an area equal to 5 times the minimum feature, squared, in which a capacitor over bit line configuration is achieved, via formation of the bit line structure, prior to the formation of the capacitor structure.

* * * * *